(12) United States Patent
Goniodsky et al.

(10) Patent No.: US 12,323,159 B2
(45) Date of Patent: Jun. 3, 2025

(54) SYSTEMS, METHODS, AND DEVICES FOR DATA CONVERTER MANAGEMENT

(71) Applicant: Cypress Semiconductor Corporation, San Jose, CA (US)

(72) Inventors: David Goniodsky, Kirkland, WA (US); Rajiv Singh, Bothell, WA (US); Masashi Kijima, Aichi (JP)

(73) Assignee: Cypress Semiconductor Corporation, San Jose, CA (US)

( * ) Notice: Subject to any disclaimer, the term of this patent is extended or adjusted under 35 U.S.C. 154(b) by 201 days.

(21) Appl. No.: 18/319,204

(22) Filed: May 17, 2023

(65) Prior Publication Data

US 2024/0388305 A1    Nov. 21, 2024

(51) Int. Cl.
*H03M 1/66* (2006.01)
*H03M 1/72* (2006.01)

(52) U.S. Cl.
CPC .............. *H03M 1/661* (2013.01); *H03M 1/72* (2013.01)

(58) Field of Classification Search
CPC .......... H03M 1/66; H03M 1/68; H03M 1/067; H03M 1/804; H03M 1/661
See application file for complete search history.

(56) References Cited

U.S. PATENT DOCUMENTS

| | | | | |
|---|---|---|---|---|
| 4,998,108 A * | 3/1991 | Ginthner | ............. | H03M 1/68 341/145 |
| 5,525,985 A * | 6/1996 | Schlotterer | ............. | G06J 1/00 341/155 |
| 5,543,590 A * | 8/1996 | Gillespie | ............. | G06F 3/0488 345/174 |
| 5,703,587 A * | 12/1997 | Clark | ............. | H03M 1/68 341/145 |
| 5,894,280 A * | 4/1999 | Ginetti | ............. | H03M 1/1019 341/120 |
| 6,137,429 A * | 10/2000 | Chan | ............. | H03M 3/324 341/143 |
| 6,271,830 B1 * | 8/2001 | Berstis | ............. | G06F 3/0338 345/157 |
| 6,922,164 B1 * | 7/2005 | Piasecki | ............. | H03M 1/462 341/163 |
| 7,236,109 B1 * | 6/2007 | Duewer | ............. | G11B 20/10009 341/123 |
| 7,286,069 B1 * | 10/2007 | Duewer | ............. | G06F 1/06 341/122 |
| 7,352,303 B1 * | 4/2008 | Duewer | ............. | H03M 1/1255 341/123 |

(Continued)

*Primary Examiner* — Lam T Mai

(57) ABSTRACT

Systems, methods, and devices enhance management of components used in data converters. Methods include receiving an input at a data converter comprising a digital to analog converter (DAC), the digital to analog converter comprising a plurality of sensing elements, and performing, using the DAC, a first conversion operation based on the input and a first set of the plurality of sensing elements identified by a first pointer value. Methods also include determining a pointer increment value based, at least in part, on an output of the first conversion operation and a hysteresis threshold value, the pointer increment value being used to determine an amount by which the first pointer value is incremented, the hysteresis threshold value identifying a threshold for determination of the pointer increment value.

20 Claims, 7 Drawing Sheets

(56) References Cited

U.S. PATENT DOCUMENTS

| | | | | |
|---|---|---|---|---|
| 7,379,834 B1* | 5/2008 | Duewer | ............... | H03L 7/00 |
| | | | | 341/122 |
| 7,456,765 B1* | 11/2008 | Duewer | ............ | H04J 3/0685 |
| | | | | 341/123 |
| 7,825,797 B2* | 11/2010 | Zawde | ............ | G06F 3/04847 |
| | | | | 715/728 |
| 9,077,369 B1* | 7/2015 | Tsang | ............... | H03M 3/338 |
| 9,397,693 B1* | 7/2016 | Jain | ............... | H03M 1/125 |
| 9,543,974 B1* | 1/2017 | Yang | ............... | H03M 1/0863 |
| 9,941,897 B1* | 4/2018 | Li | ............... | H03M 1/201 |
| 2002/0105453 A1* | 8/2002 | Fujimori | ............ | H03M 1/0665 |
| | | | | 341/144 |
| 2006/0077072 A1* | 4/2006 | Tola | ............... | G01D 5/2415 |
| | | | | 341/15 |
| 2007/0103357 A1* | 5/2007 | Alfano | ............ | G06F 15/7814 |
| | | | | 341/155 |
| 2007/0109164 A1* | 5/2007 | Arias | ............ | H03M 3/388 |
| | | | | 341/143 |
| 2016/0308547 A1* | 10/2016 | Chandra | ............ | H03M 1/1023 |
| 2017/0019118 A1* | 1/2017 | Zhu | ............... | H03M 1/0617 |
| 2019/0044524 A1* | 2/2019 | Chandra | ............ | H03M 1/066 |
| 2019/0115929 A1* | 4/2019 | Chandra | ............ | H03M 1/0624 |
| 2020/0028519 A1* | 1/2020 | Hsiao | ............... | H03M 1/067 |

* cited by examiner

SYSTEMS, METHODS, AND DEVICES FOR DATA CONVERTER MANAGEMENT

TECHNICAL FIELD

This disclosure relates to data converters, and more specifically, to enhancement of management of usage of digital to analog converters in such data converters.

BACKGROUND

Data converters may use one or more components to convert data signals from one domain to another. For example, data converters may include digital to analog converters (DACs) that are configured to convert a digital input to an analog output. Accordingly, a digital input received as a plurality of bits may be converted to an analog output signal. DACs included in data converters may have several sensing elements used to perform such conversion operations, and such sensing elements may include components, such as capacitors and/or resistors. Such capacitors and/or resistors may have variances in their values as a result of variances in a manufacturing process, or some other source of error. Conventional data converters remain limited in their ability to handle such variances and errors because they are not able to ensure that such errors are averaged out across an operational range of a data converter.

DETAILED DESCRIPTION

Figure 1:
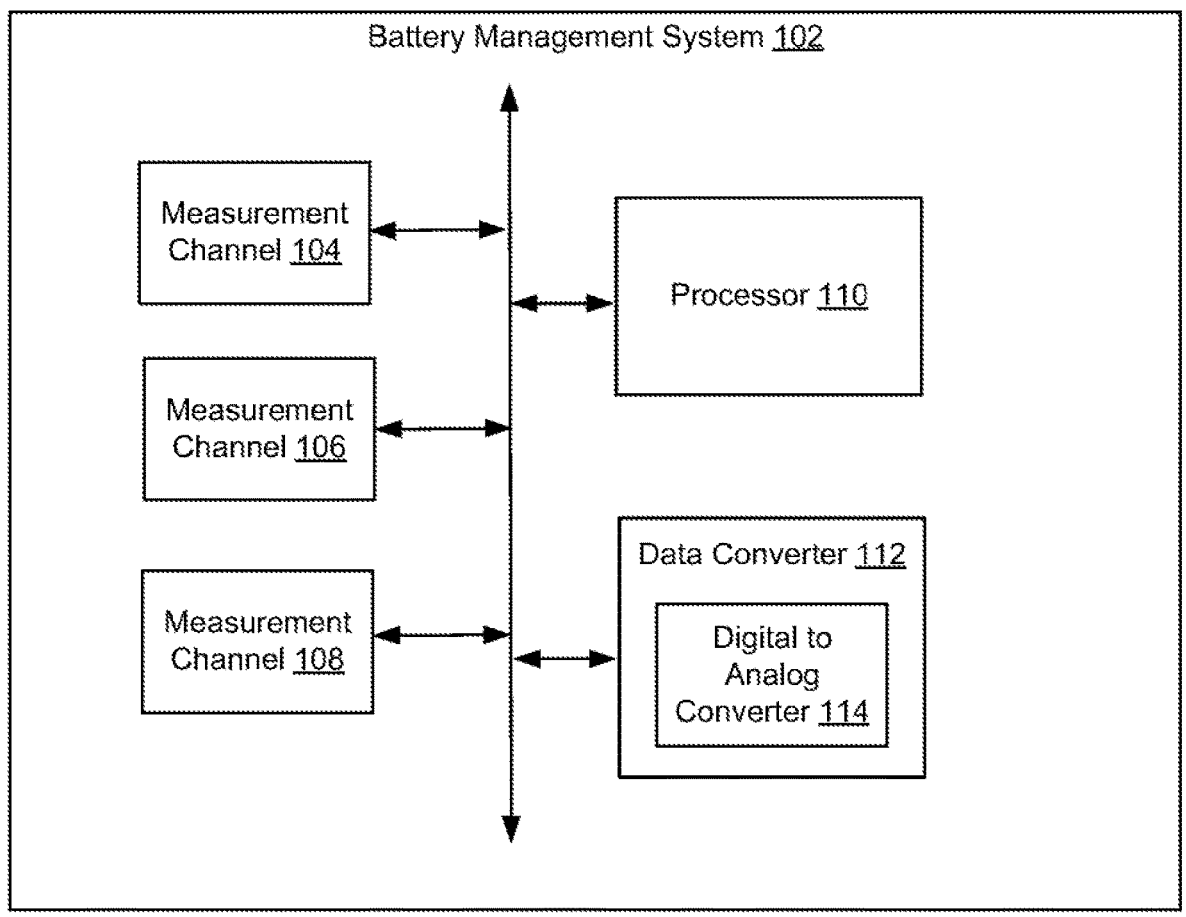
FIG. 1 illustrates an example of a battery management system, configured in accordance with some embodiments.

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

Data converters may include DACs that are used to perform data conversions. More specifically, such DACs may receive a digital input and convert it to an analog output. In various embodiments, a data converter may include a hybrid implementation of two or more DACs. For example, a data converter may include a least significant bit (LSB) DAC and a most significant bit (MSB) DAC that, in combination, operate as a 12 bit DAC. As will be discussed in greater detail below, one or more components of the data converter, such as the MSB DAC, may include multiple sensing elements that are cycled to average out errors that may associated with individual elements. Such cycling of elements may be tracked using one or more pointers. Moreover, a pointer may be incremented using a pointer increment value. In various embodiments, a pointer may be determined based on an algorithm that is used to select and use elements. Accordingly, a pointer value may be used to identify an element to be used for a conversion, and a pointer increment value may be used to increment that value for subsequent conversions. Thus, algorithms may be configured to dynamically cycle through elements used for data conversion operations. Conventional techniques for determining a pointer increment value remain limited because when an input is close to an MSB transition, an element mismatch may cause variance in the computation of a pointer increment value, and may result in sub-optimal cycling of elements.

In various embodiments, some amount of element mismatch is present due to variances in a manufacturing process. An element mismatch may cause errors in the conversion output. In embodiments where a conversion output is used to compute a pointer increment value, errors in the conversion output result in errors in the pointer increment. Accordingly, element mismatches may cause a digital output code to vary. In one example, the output code can vary by one or more bits, such as 1 LSB, due to an element mismatch. If the input is within 1 LSB of the MSB transition, that variance can cause the MSB to change, and therefore change the pointer increment value erroneously.

Embodiments disclosed herein provide the ability to ensure consistency in the cycling of elements within a DAC of a data converter to ensure variances and associated errors of individual elements are averaged out, and overall linearity performance is improved. As will be discussed in greater detail below, one or more components of data converters may be configured to decouple a determination of an output of a conversion from a determination of a pointer increment value. More specifically, DACs may be configured to implement a hysteresis threshold value when computing the pointer increment value, thus ensuring that element variances do not erroneously affect the increment of the pointer increment value. While some embodiments describe capacitance variances, it will be appreciated that element variances may refer to any variance in properties and performance of elements. As will also be discussed in greater detail below, such a hysteresis threshold value may be implemented in unidirectional or bidirectional manner.

FIG. 1 illustrates an example of a battery management system, configured in accordance with some embodiments. As will be discussed in greater detail below, a system, such as system 100, may be a battery management system that is configured to manage one or more aspects of batteries for a device. For example, system 100 may be used to manage battery usage for a low energy device, such as a Bluetooth Low Energy (BLE) device. As will also be discussed in greater detail below, one or more components of system 100 may be configured to obtain measurements from sensing channels, and utilize sensing elements to make such measurements. Embodiments disclosed herein are configured to increase accuracy and enhance linearity performance of a data converter included in system 100.

Accordingly, battery management system 102 may be implemented as part of a broader system or device, and may be specifically configured for battery management operations for such a system or device. As discussed above, such a device may be a BLE device, and battery management system 102 may be configured to perform various sensing operations to measure power levels for one or more batteries included in such a BLE device. Accordingly, battery management system 102 may include various measurement channels, such as measurement channel 104, measurement channel 106, and measurement channel 108. In various embodiments, the measurement channels may be configured to obtain measurements from one or more battery cells, and provide the measurements to other components of battery management system 102 via a bus.

Battery management system 102 may further include processor 110 which may be configured to perform one or more processing operations underlying the battery management operations performed by battery management system 102. In various embodiments, processor 110 may include processing elements implemented in reprogrammable logic, or implemented in firmware. It will be appreciated that any suitable processing logic may be used for processor 110.

Battery management system 102 may also include data converter 112. As will be discussed in greater detail below, data converter 112 may be configured to obtain measurements made by measurement channel 104, measurement channel 106, and measurement channel 108, and generate output values based on the measurements received as inputs. Accordingly, data converter 112 may include processing logic and processing elements configured to perform various pointer value determination operations and hysteresis threshold value determination operations discussed in greater detail below. In one example, data converter 112 may be a 12-bit oversampling data converter. Moreover, data converter 112 may include various components, such as digital to analog converter 114. As will be discussed in greater detail below, digital to analog converter 114 may include various analog components included in different sensing elements. Such analog components may have variances and non-linearities that may result in variances in measurements and outputs generated using such sensing elements. Accordingly, cycling through elements included in the digital to analog converter may be performed to average out variances between elements.

As will be discussed in greater detail below, embodiments disclosed herein are configured to implement such cycling in a manner that ensures that selection and cycling of such elements remains consistent throughout operation of digital to analog converter 114. More specifically, a designated threshold value may be computed and utilized when determining an increment value associated with the elements to ensure that the increment value is determined when the system has reached increased stability, and accordingly, ensure that the increment value is consistently determined. Such increased consistency in the determination of the increment value ensures that elements utilized in digital to analog converter 114 are cycled properly, and non-linearities due to dead zones are reduced.

Figure 2:
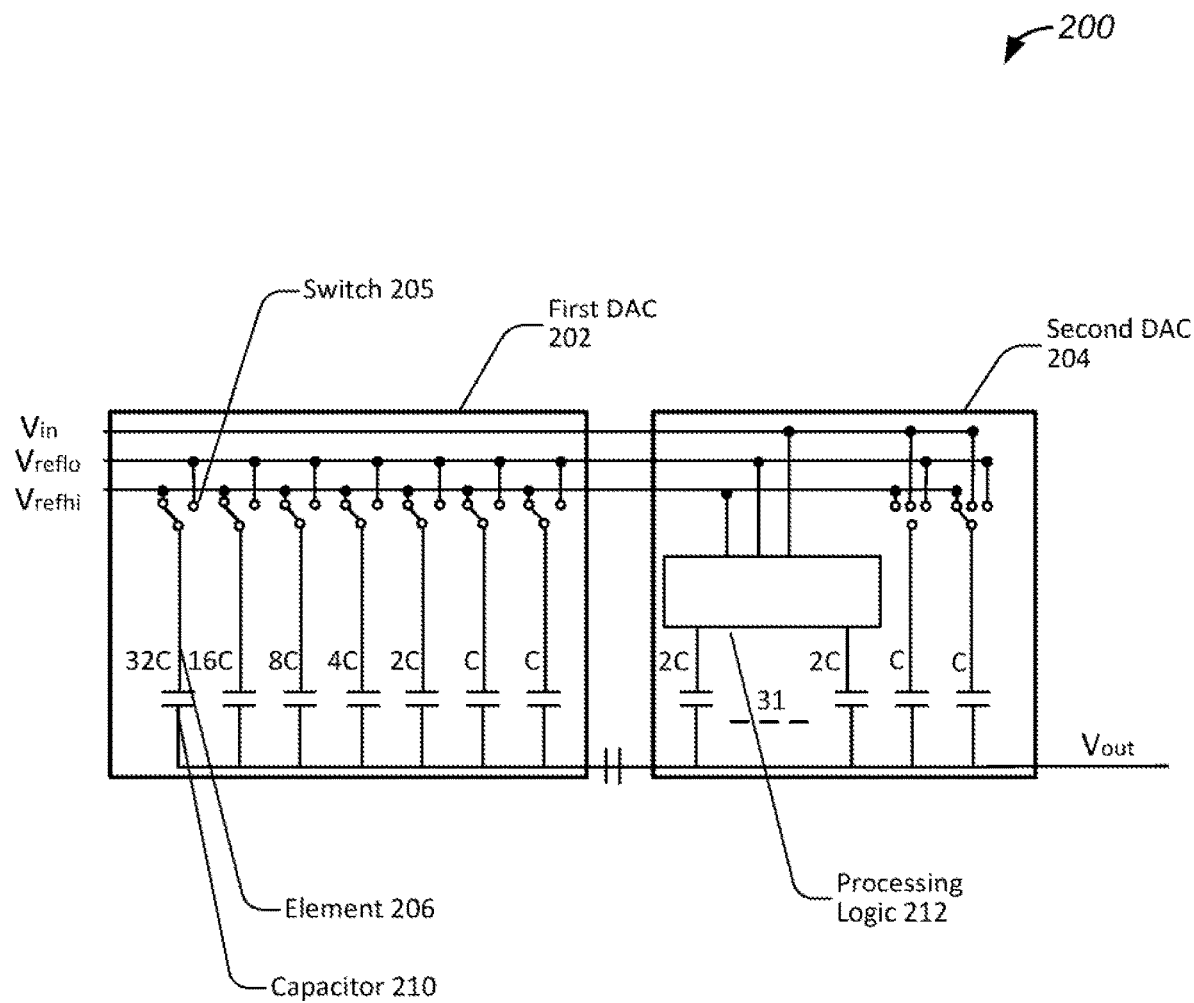
FIG. 2 illustrates an example of a device for data converter management, configured in accordance with some embodiments.

FIG. 2 illustrates an example of a device for data converter management, configured in accordance with some embodiments. As similarly discussed above, a battery management system may include components, such as a data converter that includes one or more DACs. More specifically, a data converter, such as data converter 200, may include DACs configured to implement data converter 200. As will be discussed in greater detail below, usage of elements within the DACs may be managed to increase accuracy and enhance linearity performance of data converter 200.

In some embodiments, data converter 200 is configured as a segmented DAC that includes first DAC 202 that may be configured as a least significant bit (LSB) DAC. More specifically, first DAC 202 is configured to convert smaller levels and implement smaller increments than second DAC 204 discussed in greater detail below. As shown in FIG. 2, first DAC 202 includes one or more elements corresponding to bits. For example, first DAC 202 may include element 206 that includes capacitor 210 having a value configured for that bit. Moreover, elements may be selected using switches, such as switch 205. In one example, data converter 200 is a 12-bit data converter. In this example, first DAC 202 includes elements corresponding to 7 bits. In some embodiments, first DAC 202 may be a binary weighted DAC.

Data converter 200 further includes second DAC 204 that may be configured as a most significant bit (MSB) DAC. In some embodiments, second DAC 204 may be thermometer weighted. Accordingly, second DAC 204 may include processing logic 212 which is configured to be thermometer coded. In the example of a 12-bit data converter, second DAC 204 includes elements used for 5 bits. Accordingly, in data converter 200, a thermometer weighted DAC is used for the MSBs, and a binary weighted DAC is used for the LSBs.

As will be discussed in greater detail below, second DAC 204 is configured to perform dynamic element matching in which elements used by second DAC 204 are dynamically selected. As similarly discussed above, capacitors may have variances that affect their accuracy. Accordingly, an algorithm is used to dynamically cycle through and select different elements having different capacitors to effectively average out the variances. For example, an algorithm may be implemented to set a pointer that identifies an active and/or selected element, as may be denoted by an index value configured as a unique identifier, and also determine an increment value that identifies where the pointer should be set for a subsequent iteration of operations performed by data converter 200. In some embodiments, the algorithm used for element selection is a bidirectional data weighted averaging algorithm. Accordingly, while many embodiments disclosed herein describe the use of one pointer, it will be appreciated that two pointers may be used where one pointer is used for alternating conversions. Where conversions are numbered, they may be represented as even and odd conversions. In one example, a position of a pointer may be determined as an output modulo of a total number of elements. An example of such an algorithm is given by equation 1 shown below:

$$P = \sum_{0}^{i} D_i \bmod 31 \quad (1)$$

In equation 1, P is the pointer position for a current conversion (which may range from 0 to N−1, where N is a total number of elements in the MSB DAC). In one example, the pointer position may range from 0-30. Moreover, $D_0, \ldots, D_i$ are the top 5 bits of previous outputs. As similarly discussed above, a total number of elements may be 31 where second DAC 204 includes 31 thermometer capacitors. In this example, the top 5 bits of a previous conversion, $D_0, \ldots, D_i$, are used to determined to be a pointer increment value. As will be discussed in greater detail below, if a pointer increment is constant, the value of the pointer position P will traverse every value between 0 and 30 before repeating. In this way, every element will be used once before elements are reused, thus ensuring that variance between elements is sufficiently distributed and averaged.

In various embodiments, when a representation of an input generated by a DAC and provided to an ADC is close to an MSB transition (such as a transition from X-1 to X where X=2^[number of bits in LSB DAC], e.g. 127-128 or 2047-2048), a pointer increment value can vary between two values due to capacitor mismatch (e.g. 0-1 or 15-16) or other property mismatch associated with an element. This may cause the pointer to cycle through a subset of values, and only a limited number of elements are used. Additional details regarding such use of subsets are discussed in greater detail below with reference to FIG. 7A. Accordingly, embodiments disclosed herein are configured to implement a designated threshold value to ensure that such sub-optimal cycling due to capacitor mismatch is reduced. More specifically, logic that is configured to determine the pointer increment value is configured to consider a previous pointer increment value and an LSB of a previous conversion to compute a pointer increment value that is not affected by element mismatch.

In various embodiments, a hysteresis value may be computed using the implementation of a hysteresis threshold value. More specifically, a hysteresis threshold value may be configured such that it is large enough to prevent a change in a pointer increment value due to various error sources, as similarly discussed above. For example, such error sources may include capacitor mismatches and noise. In one example, a peak error value can be approximated as 3 multiplied by a square root of the sum of the variances. Accordingly, such a hysteresis threshold value may be computed using equation 2 given below:

$$\text{THRESHOLD } (LSB) = \left[ 3 \frac{V_{pk}}{V_{RMS}} \cdot \sqrt{\sigma_{COMP}^2 + \sigma_{DAC}^2} \cdot \frac{2^{12} LSB}{V_{REF} V} \right] \quad (2)$$

In various embodiments, $\sigma_{COMP}$ is a noise associated with a comparator, and $\sigma_{DAC}$ is a maximum integral nonlinearity of a resistor string or capacitive elements included in a DAC. Such values may result from aspects of a manufacturing process, and may be determined by an entity, such as a manufacturer. A peak voltage ($V_{pk}$), root-mean-square voltage ($V_{RMS}$), and reference voltage ($V_{REF}$) may be determined based on system measurements and/or values determined by an entity, such as a manufacturer.

Accordingly, the implementation of the determination of the pointer increment value after the generation of an output by a conversion operation may be configured and implemented based on a hysteresis threshold value. Embodiments disclosed herein are configured to implement such a hysteresis threshold value in a unidirectional or bidirectional manner. For example, the hysteresis threshold value may be implemented for only negative or decreasing transitions of an MSB DAC. In another example, the hysteresis threshold value may be implemented for only positive or increasing transitions of an MSB DAC. In yet another example, the hysteresis threshold value may be implemented for both types of transitions.

Figure 3:
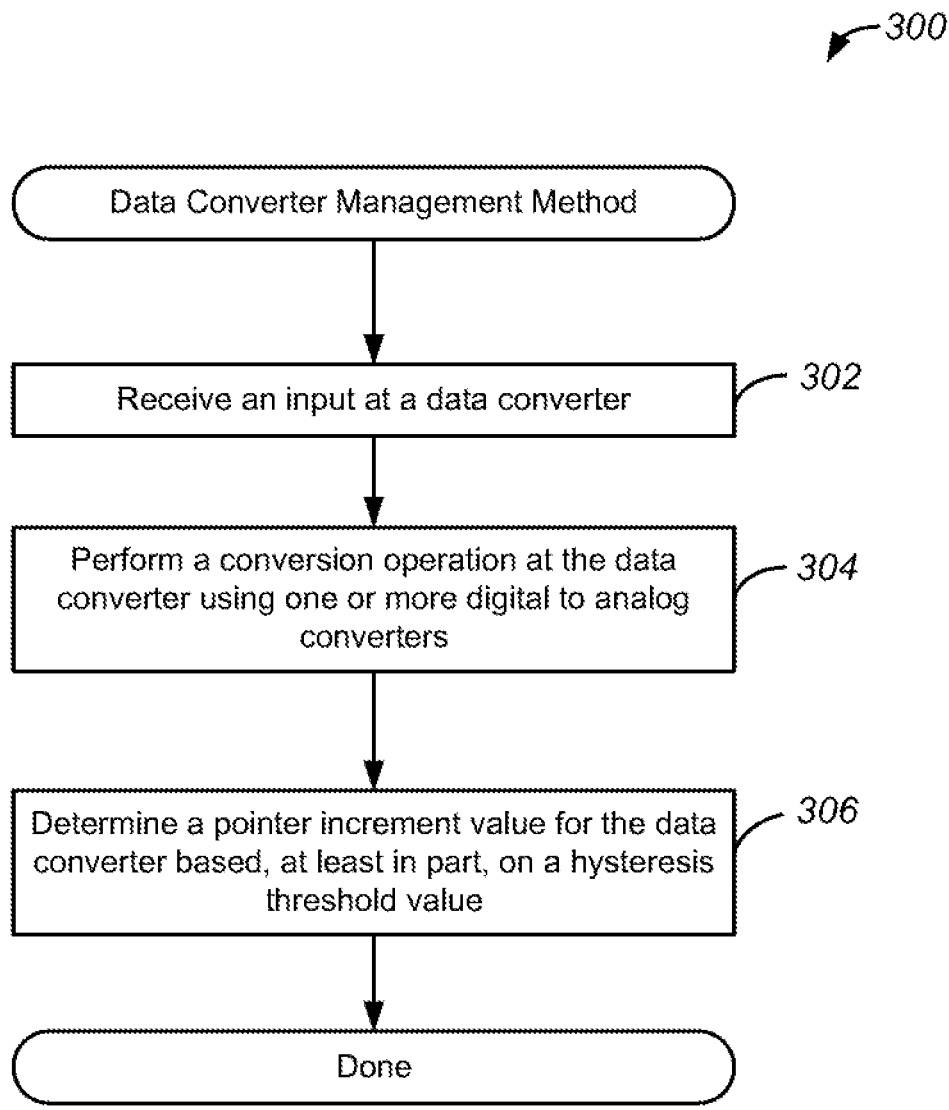
FIG. 3 illustrates an example of a method for data converter management, performed in accordance with some embodiments.

FIG. 3 illustrates an example of a method for data converter management, performed in accordance with some embodiments. As similarly discussed above, a method, such as method 300, may be performed to manage one or more aspects of a battery for a device. For example, method 300 may be performed to obtain measurements from sensing channels, and utilize sensing elements to make such measurements. As will be discussed in greater detail below, embodiments disclosed herein are configured to increase accuracy and enhance linearity performance of a data converter by conditioning a determination of an increment value based on a history or previous state of the data converter.

Method 300 may perform operation 302 during which an input may be received. In various embodiments, the input may be received from one or more components of the battery management system associated with a measurement channel. In one example, the input may be received from a component, such as an output buffer or an analog to digital converter (ADC) of a measurement channel. As similarly discussed above, the input may be received via a bus or other system component, such as a multiplexer.

Method 300 may perform operation 304 during which a conversion operation may be performed. Accordingly, the input may be provided to the data converter, and the conversion operation may be performed. As similarly discussed above, the conversion operation may be performed using a hybrid implementation of an LSB DAC and an MSB DAC. Accordingly, each of the LSB DAC and MSB DAC may be used to handle their respective input bits.

Method 300 may perform operation 306 during which a pointer increment value may be determined. More specifically, the pointer increment value may be determined based on an output of the conversion operation. In some embodiments, the pointer increment value may be determined based on an output value generated during operation 304 as well as a hysteresis threshold value. As will be discussed in greater detail below, the determination of the pointer increment value may be conditioned on a previous state of the system to improve consistency of the pointer increment value determination and make such a determination less prone to variances resulting from errors from elements, such as variances in capacitor values that may be a result of, for example, a manufacturing process. Accordingly, during operation 306, a hysteresis threshold value may be computed, and a pointer increment value may be determined for subsequent data conversions. In various embodiments, the hysteresis threshold value may have been previously determined by an entity, such as a manufacturer, during a manufacturing and/or design process. Accordingly, during operation 306, the hysteresis threshold value may be retrieved and used to determine the pointer increment value.

Figure 4:
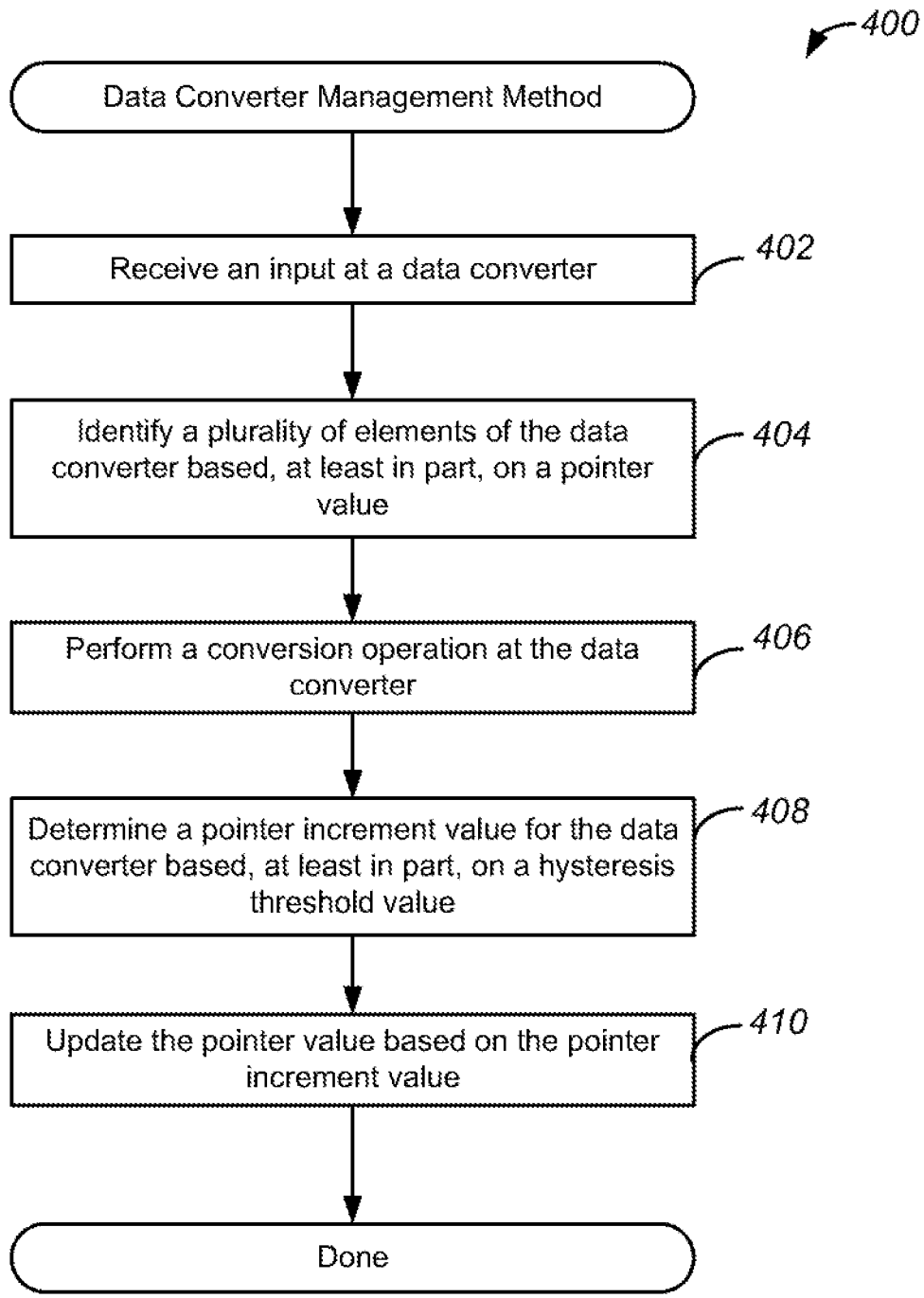
FIG. 4 illustrates another example of a method for data converter management, performed in accordance with some embodiments.

FIG. 4 illustrates another example of a method for data converter management, performed in accordance with some embodiments. As similarly discussed above, a method, such as method 400, may be performed to manage one or more aspects of a battery for a device. For example, method 400 may be performed to increase accuracy and enhance linearity performance of a data converter by conditioning a determination of an increment value on a history or previous state of the data converter.

Method 400 may perform operation 402 during which an input may be received. In various embodiments, the input may be received from one or more components of the battery management system associated with a measurement channel. In one example, the input may be received from a component, such as an output buffer or an analog to digital converter (ADC) of a measurement channel. As similarly discussed above, the input may be received via a bus or other system component, such as a multiplexer.

Method 400 may perform operation 404 during which a plurality of elements of a data converter may be identified based, at least in part, on a pointer value. According to various embodiments, the pointer value may have been determined based on a previous iteration of method 400, or based on a default value. Such a pointer value may be retrieved and used to select a particular element. Moreover, a current pointer increment value may be used to select a designated number of elements starting from an index of the element identified by the pointer value. Accordingly, during operation 404, a designated number of the plurality of elements may be identified and reserved for a data conversion operation. As discussed above, the first set of elements may be included in an MSB DAC, and may be selected from a plurality of thermometer capacitor elements.

Method 400 may perform operation 406 during which a conversion operation may be performed. Accordingly, the input may be provided to the data converter, and the conversion operation may be performed. As discussed above, the conversion operation may be performed using an LSB and MSB DAC. Moreover, the plurality of elements may be used to handle the MSB of the input signal for the conversion operation.

Method 400 may perform operation 408 during which a pointer increment value may be determined. As similarly discussed above, the pointer increment value may be determined based on an output of the conversion operation. Thus, the pointer increment value may be determined based on an output value generated during operation 406. In various embodiments, the pointer increment value is determined based on a hysteresis threshold value. As previously discussed, the determination of a pointer increment value may be conditioned on a previous state of the system to improve consistency of the pointer increment value determination. Accordingly, a hysteresis threshold value may be computed as described above, and a new pointer increment value may be determined responsive to the received input exceeding the threshold value relative to an MSB transition.

As similarly discussed above, the threshold value may be configured as a threshold of an input voltage such that a previous output value is used if the threshold value is not exceeded, and a new output value is used if the threshold value is exceeded. Moreover, the threshold depends on what the previous pointer increment was. For example, based on a threshold value, an output may need to be greater than the MSB transition by 3 LSB for the pointer increment value to increase, and may need to be less than the MSB transition by 2 LSB for the pointer increment value to decrease. As will be discussed in greater detail below with reference to FIG. 6B, a hysteresis curve may represent such application of hysteresis threshold values. As will also be discussed in greater detail below, such threshold values may be symmetric, where an amount by which the output needs to exceed the MSB transition is the same for both increasing and decreasing pointer value increments. However, threshold values may be asymmetric as well, and may use different threshold values for increasing and decreasing pointer value increments.

Method 400 may perform operation 410 during which the pointer value may be updated based, at least in part, on the pointer increment value. In various embodiments, the pointer value may be updated by incrementing an index of the element identified by the pointer value by the pointer increment value. Accordingly, the element index identified by the pointer value during operation 404 may be updated by incrementing the pointer value by the pointer increment value thus computing a new pointer value having a new element index value.

Figure 5:
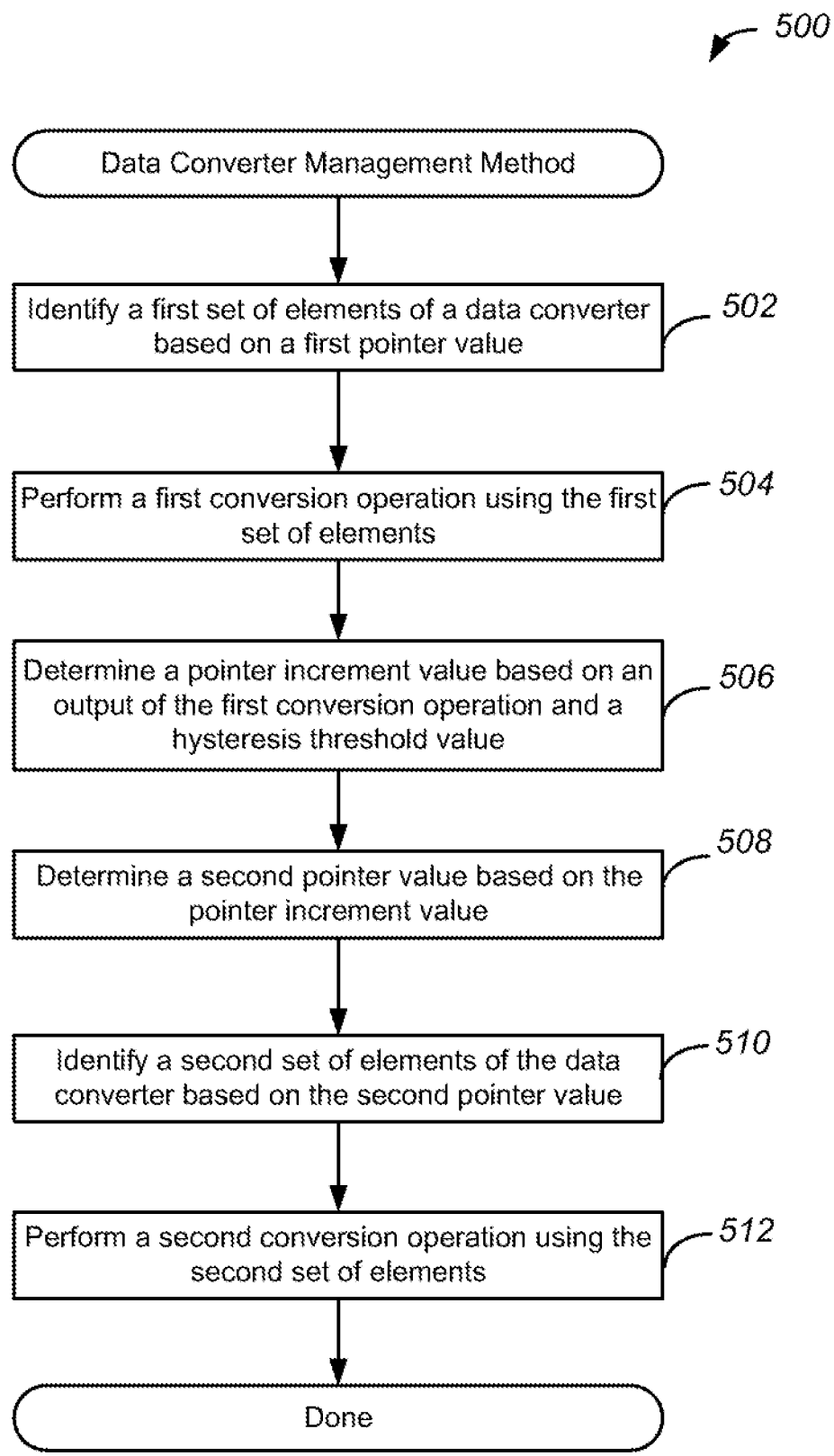
FIG. 5 illustrates yet another example of a method for data converter management, performed in accordance with some embodiments.

FIG. 5 illustrates yet another example of a method for data converter management, performed in accordance with some embodiments. As similarly discussed above, a method, such as method 500, may be performed to facilitate battery management for a device. As will be discussed in greater detail below, method 500 may be performed to implement operations associated with data conversions, and pointer increment operations underlying data converter operations performed in the context of such battery management. Accordingly, embodiments disclosed herein increase accuracy and enhance linearity performance of a data converter by conditioning a determination of an increment value based on a history or previous state of the data converter.

Method 500 may perform operation 502 during which a first set of elements of a data converter may be identified based, at least in part, on a first pointer value. As similarly discussed above, a pointer value may have been determined based on a previous iteration of method 500, or based on a default value. Such a pointer value may be retrieved and used to select a particular element. Moreover, a current pointer increment value may be used to select a designated number of elements starting from a first element index identified by the first pointer value. Accordingly, during operation 502, a first designated number of the plurality of elements may be identified and reserved for a first data conversion operation. As discussed above, the first set of elements may be included in an MSB DAC, and may be selected from a plurality of thermometer capacitor elements.

Method 500 may perform operation 504 during which a first conversion operation may be performed. Accordingly, a first input may be provided to the data converter, and the first conversion operation may be performed. As discussed above, the first conversion operation may be performed using a hybrid implementation of an LSB DAC and an MSB DAC. Moreover, the first set of elements may be used to process the MSB of the input signal and facilitate data conversion for the first conversion operation.

Method 500 may perform operation 506 during which a pointer increment value may be determined. As similarly discussed above, the pointer increment value may be determined based on an output of the first conversion operation. Thus, the pointer increment value may be set based on an output value generated during operation 504. In various embodiments, the pointer increment value is determined based on a hysteresis threshold value. Accordingly, a hysteresis threshold value may be computed as described above, and a pointer increment value may be determined responsive to the received input exceeding the threshold value relative to an MSB transition.

Method 500 may perform operation 508 during which a second pointer value may be determined based, at least in part, on the pointer increment value. In various embodiments, the second pointer value is determined by incrementing an index of the element identified by the first pointer value by the pointer increment value. Accordingly, the index of the first pointer value may be incremented by the pointer increment value to compute the second pointer value, and the second pointer value may be used for subsequent conversion operations.

Method 500 may perform operation 510 wherein a second set of elements of a data converter may be identified based, at least in part, on the second pointer value. Accordingly, the second pointer value may be used to identify a second element index for that second pointer value, and the pointer increment value may be used to select a second set of elements starting from the second element index identified by the second pointer value. Accordingly, during operation 510, a second designated number of the plurality of elements may be identified and reserved for a second data conversion operation. As discussed above, the second set of elements may be included in an MSB DAC, and may be selected from a plurality of thermometer capacitor elements.

Method 500 may perform operation 512 during which a second conversion operation may be performed. Accordingly, a second input may be provided to the data converter, and the second conversion operation may be performed. As discussed above, the second conversion operation may be performed using a hybrid implementation of an LSB DAC and an MSB DAC. Moreover, the second set of elements may be used to handle the MSB of the input signal for the second conversion operation.

Figure 6A:
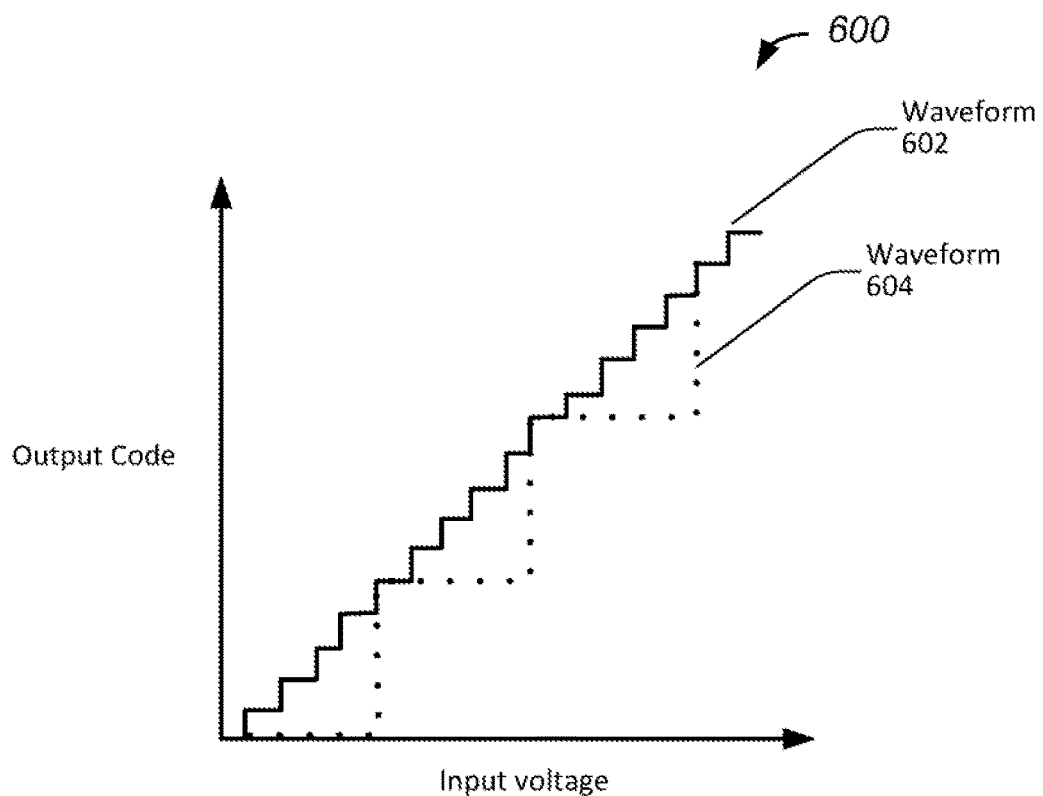
FIG. 6A illustrates a diagram of an example of digital to analog converter behaviors, configured in accordance with some embodiments.

FIG. 6A illustrates a diagram of an example of digital to analog converter behaviors, configured in accordance with some embodiments. As shown in FIG. 6A, an input value may be provided to an LSB DAC and an MSB DAC of a data converter. In response to receiving an input value, an output may be generated by each DAC as an output of a conversion operation. Accordingly, waveform 602 illustrates a transfer characteristic of an ADC, which may be a sum of LSB and MSB DAC outputs, in response to receiving increased input values, and waveform 604 illustrates an output of an MSB DAC in response to receiving increased input values. The steps in the waveforms represent transitions where an output of the DAC increases in response to the increase in the input value.

Figure 6B:
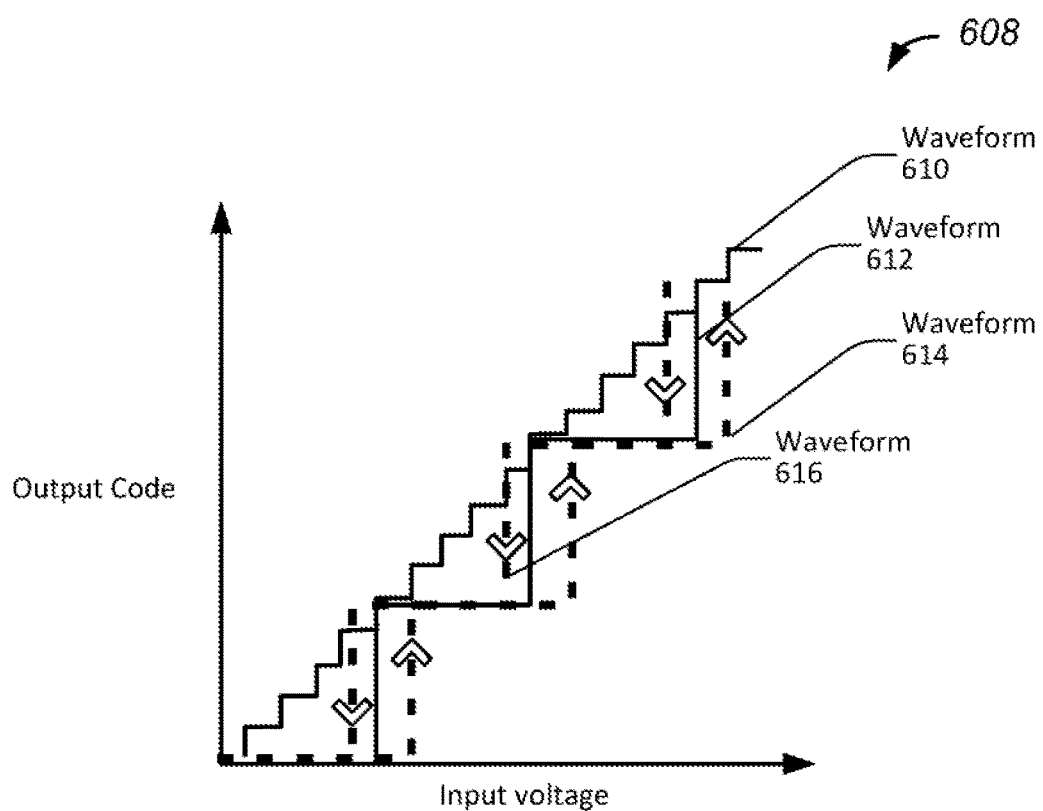
FIG. 6B illustrates a diagram of another example of digital to analog converter behaviors, configured in accordance with some embodiments.

FIG. 6B illustrates a diagram of another example of digital to analog converter behaviors, configured in accordance with some embodiments. As shown in diagram 608, an input value may be provided to an LSB DAC and an MSB DAC of a data converter. As similarly discussed above, in response to receiving an input value, an output may be generated by each DAC as an output of a conversion operation. As also discussed above, waveform 610 illustrates a transfer characteristic of an ADC, which may be a sum of LSB and MSB DAC outputs, in response to receiving increased input values, and waveform 612 illustrates an output of an MSB DAC in response to receiving increased input values.

FIG. 6B additionally illustrates waveform 614 which represents a pointer value determined by the data converter. As shown in diagram 608, the determination of the pointer value is implemented in accordance with one or more hysteresis threshold values that provide an offset between a pointer increment determination and an MSB transition. Such an offset may be represented in one or more stored data values, such as bits, or a designated number of LSBs. Accordingly, a hysteresis threshold value may be defined based on features of an output of a DAC, such as voltage levels or bit transitions. Furthermore, a hysteresis threshold value may be configured to identify a threshold representing a designated offset from one or more features of an output, such as an MSB transition. The threshold may be defined as a voltage offset, or a bit transition offset, as may be represented by, for example, a number of LSBs. In this way, the hysteresis threshold value is configured to prevent a pointer increment value from changing when an output of the DAC changes by a relatively small amount, and may instead determine the pointer increment value in response to a threshold crossing.

In some embodiments, a hysteresis threshold value may be implemented for each of a positive transition where an output of the DAC increases, and a negative transition where an output of the DAC decreases. Moreover, for a bidirectional algorithm, as described above, two pointers may be associated with each transition and associated hysteresis threshold values. Accordingly, two hysteresis threshold values may be used, where each hysteresis threshold value is used for two pointers, such as a forward and a backward pointer. In one example, a first hysteresis threshold value is used for positive transitions associated with increases in a DAC output, as represented by waveform 614. Moreover a second hysteresis threshold value may be used for negative transitions associated with decreases in a DAC output, as represented by waveform 616. As similarly discussed above, conversions and associated transitions may include the incrementing of pointer values, such as adding a pointer increment value to a forward pointer and subtracting the pointer increment value from a backward pointer.

Figure 7A:
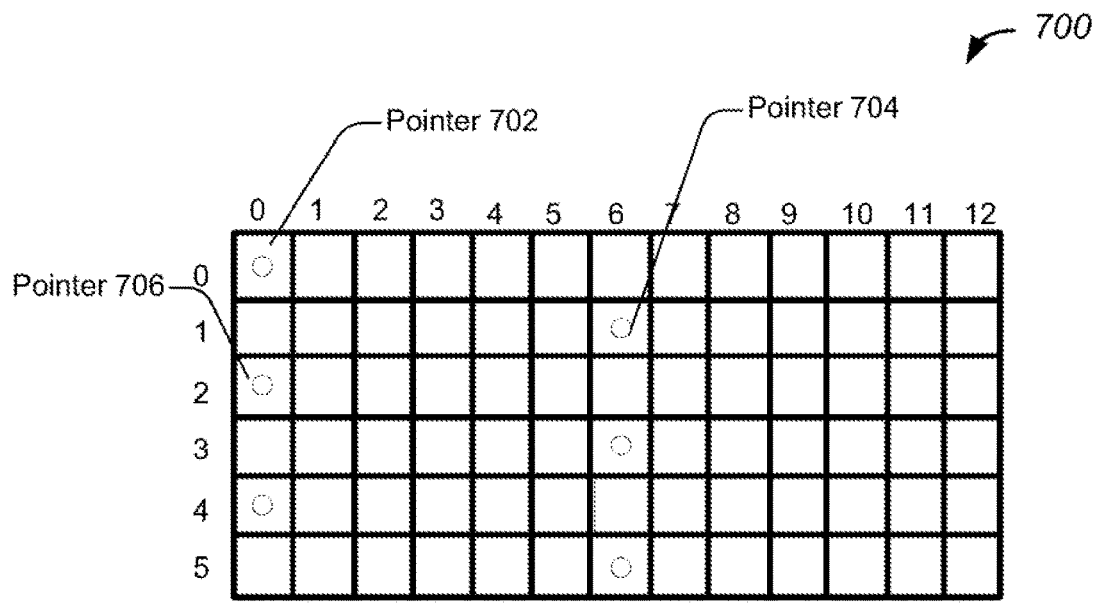
FIG. 7A illustrates a diagram of an example of the usage of pointer values, performed in accordance with some embodiments.

FIG. 7A illustrates a diagram of an example of the usage of pointer values, performed in accordance with some embodiments. As shown in FIG. 7A, a representation of different elements and associated element indexes is shown. In one example, diagram 700 represents element indices of an MSB DAC. More specifically, the horizontal axis identifies different element indices, and the vertical axis represents different data conversions. Thus, diagram 700 illustrates which elements are selected for which data conversion. Moreover, dots are used to represent pointer locations, such as pointer 702, pointer 704, and pointer 706, which may each correspond to different successive conversion operations. Moreover, shaded elements are used to represent elements selected for a data conversion. In the example shown in diagram 700 an MSB DAC may have a non-constant output. In one example, this may be the case even if the input is constant, and the pointer increment varies around half the total number of elements, or when elements 0-5 are 1 LSB larger than elements 6-12. In this example, the pointer increment value is not constant and oscillates between 6 and 7 resulting in only two groups of elements are used.

Figure 7B:
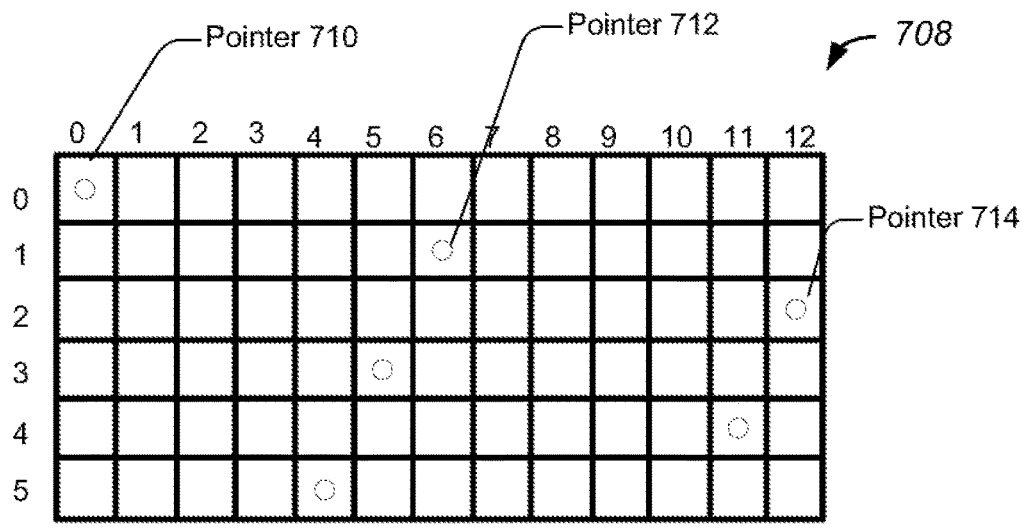
FIG. 7B illustrates a diagram of another example of the usage of pointer values, performed in accordance with some embodiments.

FIG. 7B illustrates a diagram of another example of the usage of pointer values, performed in accordance with some embodiments. As shown in FIG. 7B, a representation of different elements and associated element indexes is shown. As similarly discussed above, diagram 708 represents element indices of an MSB DAC. Moreover, dots are used to represent pointer locations, such as pointer 710, pointer 712, and pointer 714, which may each correspond to different successive conversion operations. In the example shown in diagram 708 an MSB DAC may have constant output of 6. Pointer positions may be incremented by a same amount after each conversion operation, as determined by a pointer increment value. As discussed above, the pointer increment value may be determined using a hysteresis threshold value that ensures consistency in the determination of the pointer increment value. Accordingly, when the element index number wraps due to a modulo operation, it lands on an unused value, and every group of 6 elements is used before one is reused. While diagram 708 shows a total of 13 elements, it will be appreciated that any suitable number may be used. For example, the number may be 31, as discussed above.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A method comprising:
receiving an input at a data converter comprising a digital to analog converter (DAC), the digital to analog converter comprising a plurality of sensing elements;
performing, using the DAC, a first conversion operation based on the input and a first set of the plurality of sensing elements identified by a first pointer value; and
determining a pointer increment value based, at least in part, on an output of the first conversion operation and a hysteresis threshold value, the pointer increment value being used to determine an amount by which the first pointer value is incremented, the hysteresis threshold value identifying a threshold for determination of the pointer increment value.

2. The method of claim 1, wherein the first pointer value identifies an element index of one of the first set of the plurality of sensing elements.

3. The method of claim 2, wherein a number of elements included in the first set of the plurality of sensing elements is determined based on a previous output of a previous conversion operation.

4. The method of claim 1 further comprising:
determining a second pointer value by incrementing the first pointer value by the pointer increment value.

5. The method of claim 4 further comprising:
identifying a second set of the plurality of sensing elements based, at least in part, on the second pointer value.

6. The method of claim 5 further comprising:
performing a second conversion operation using the second set of the plurality of sensing elements.

7. The method of claim 6, wherein a number of the first set of the plurality of sensing elements is the same as a number of the second set of the plurality of sensing elements.

8. The method of claim 1, wherein the DAC is a most significant bit (MSB) DAC.

9. The method of claim 8, wherein the DAC is a thermometer weighted DAC.

10. A system comprising:
a measurement channel configured to obtain one or more measurements from a battery; and
a data converter configured to receive an input from the measurement channel, the data converter comprising:
a least significant bit (LSB) digital to analog converter (DAC) configured to perform first portion of a first conversion operation; and
a most significant bit (MSB) DAC configured to perform second portion of the first conversion operation,
wherein the data converter is further configured to determine a pointer increment value based, at least in part, on an output of the first conversion operation and a hysteresis threshold value, the pointer increment value being used to determine an amount by which a first pointer value is incremented, the hysteresis threshold value identifying a threshold for determination of the pointer increment value.

11. The system of claim 10, wherein the first pointer value identifies an element index of one of a first set of a plurality of sensing elements included in the MSB DAC.

12. The system of claim 11, wherein a number of elements included in the first set of the plurality of sensing elements is determined based on a previous output of a previous conversion operation.

13. The system of claim 11, wherein the data converter is further configured to:
determine a second pointer value by incrementing the first pointer value by the pointer increment value; and
identify a second set of the plurality of sensing elements based, at least in part, on the second pointer value.

14. The system of claim 13, wherein a number of the first set of the plurality of sensing elements is the same as a number of the second set of the plurality of sensing elements.

15. The system of claim 10, wherein the LSB DAC is a binary weighted DAC, and wherein the MSB DAC is a thermometer weighted DAC.

16. A device comprising:
a least significant bit (LSB) digital to analog converter (DAC) configured to perform first portion of a first conversion operation; and
a most significant bit (MSB) DAC configured to perform second portion of the first conversion operation,
processing elements configured to determine a pointer increment value based, at least in part, on an output of the first conversion operation and a hysteresis threshold value, the pointer increment value being used to determine an amount by which a first pointer value is incremented, the hysteresis threshold value identifying a threshold for determination of the pointer increment value.

17. The device of claim 16, wherein the first pointer value identifies an element index of one of a first set of a plurality of sensing elements included in the MSB DAC.

18. The device of claim 17, wherein a number of elements included in the first set of the plurality of sensing elements is determined based on a previous output of a previous conversion operation.

19. The device of claim 17, wherein the processing elements are further configured to:
determine a second pointer value by incrementing the first pointer value by the pointer increment value; and
identify a second set of the plurality of sensing elements based, at least in part, on the second pointer value.

20. The device of claim 16, wherein the LSB DAC is a binary weighted DAC, and wherein the MSB DAC is a thermometer weighted DAC.

* * * * *